United States Patent
Takahashi

(10) Patent No.: US 7,554,263 B2
(45) Date of Patent: Jun. 30, 2009

(54) LIGHT EMITTING DEVICE HAVING TRANSPARENT FILM VARYING REFRACTIVE INDEX AND MANUFACTURING METHOD THEREOF

(75) Inventor: Masahiro Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 251 days.

(21) Appl. No.: 10/773,587

(22) Filed: Feb. 6, 2004

(65) Prior Publication Data

US 2004/0160171 A1  Aug. 19, 2004

(30) Foreign Application Priority Data

Feb. 12, 2003  (JP)  ............... 2003-033054

(51) Int. Cl.
  H05B 33/00  (2006.01)
  H05B 33/04  (2006.01)
(52) U.S. Cl. .......... 313/506; 313/504; 313/512; 428/690; 428/917; 257/100
(58) Field of Classification Search ........... 313/506
  See application file for complete search history.

(56) References Cited

U.S. PATENT DOCUMENTS

| | | | | |
|---|---|---|---|---|
| 5,003,221 | A * | 3/1991 | Shimizu | 313/509 |
| 5,869,929 | A * | 2/1999 | Eida et al. | 313/501 |
| 6,157,426 | A * | 12/2000 | Gu | 349/111 |
| 6,623,862 | B2 * | 9/2003 | Choi et al. | 428/428 |
| 6,673,659 | B2 | 1/2004 | Sakama et al. | 438/149 |
| 6,689,492 | B1 * | 2/2004 | Yamazaki et al. | 428/690 |
| 6,894,431 | B2 * | 5/2005 | Yamazaki et al. | 313/498 |
| 2001/0004121 | A1 * | 6/2001 | Sakama et al. | 257/347 |
| 2001/0016262 | A1 * | 8/2001 | Toyoshima et al. | 428/428 |
| 2001/0041268 | A1 * | 11/2001 | Arai et al. | 428/690 |
| 2003/0160247 | A1 | 8/2003 | Miyazawa | 257/79 |
| 2004/0008968 | A1 * | 1/2004 | Lee et al. | 385/142 |

(Continued)

FOREIGN PATENT DOCUMENTS

EP  1 377 134 A1  1/2004

(Continued)

OTHER PUBLICATIONS

Tang, C.W. et al, "Organic Electroluminescent Diodes," Appl. Phys. Lett., vol. 51, No. 12, pp. 913-915, Sep. 21, 1987.

(Continued)

*Primary Examiner*—Sikha Roy
(74) *Attorney, Agent, or Firm*—Cook Alex Ltd.

(57) ABSTRACT

A method for manufacturing a light emitting device with higher light extraction efficiency, lower consumption, longer operation life, and higher reliability can be provided. The light emitting device of the present invention comprises a substrate having an insulating surface, a transparent film formed over the substrate having the insulating surface, a first electrode formed over the transparent film, a layer including an organic compound formed over the first electrode, and a second electrode formed over the layer including the organic compound, wherein the refractive index of the transparent film sequentially varies from an interface at the side of the substrate having the insulating surface to an interface at the side of the first electrode.

18 Claims, 11 Drawing Sheets

U.S. PATENT DOCUMENTS

| | | |
|---|---|---|
| 2004/0119400 A1 | 6/2004 | Takahashi et al. |
| 2004/0124770 A1* | 7/2004 | Hayashi et al. ............. 313/506 |
| 2004/0166362 A1* | 8/2004 | Utsumi et al. ............... 428/690 |
| 2006/0158109 A1 | 7/2006 | Takahashi et al. |

FOREIGN PATENT DOCUMENTS

| | | |
|---|---|---|
| JP | 7-211458 | 8/1995 |
| JP | 2001-284040 | 10/2001 |
| JP | 2002-359070 | 12/2002 |
| JP | 2003-195775 | 7/2003 |
| WO | WO 02/080626 A1 | 10/2002 |

OTHER PUBLICATIONS

Adachi, C. et al, "Electroluminescence in Organic Films with Three-Layer Structure," Japanese Journal of Applied Physics, vol. 27, No. 2, pp. L269-L271, Feb. 1988.

* cited by examiner

LIGHT-EMISSION

LIGHT EMITTING DEVICE HAVING TRANSPARENT FILM VARYING REFRACTIVE INDEX AND MANUFACTURING METHOD THEREOF

BACKGROUND OF THE INVENTIOTN

Field of the Invention

The present invention relates to a light emitting device using a light emitting element from which luminescence is obtained by applying an electric field to an element provided with a film containing an organic compound (hereinafter referred to as an organic compound layer) between a pair of electrodes, and to a method of manufacturing the same.

In recent years, study of a light emitting device having an electro luminescence (EL) element (hereinafter referred to as an EL element) as a self-luminous element has become vigorous. In particular, a light emitting device using an organic material as an EL material has attracted an attention. The light emitting device is also referred to as an EL display.

The light emitting device has no viewing angle difficulties because of its self-luminous property differently from a liquid crystal display device. The light emitting device has higher visibility and thus, various types of usage such as a display have been proposed.

An EL element includes a film containing an organic compound in which luminescence (Electro Luminescence) generated by applying an electric field (hereinafter, referred to as an EL layer) is obtained, an anode, and a cathode.

In the EL element, the EL layer sandwiched between a pair of electrodes has a laminated structure, generally. The basic structure in an existing organic light emitting element is proposed by Tang et al. of Kodak Eastman Company in 1987. (Refer to non-patent literature. 1. "Applied Physics letters." Vol. 51, No. 12, p. 913-915 (1987) C. W. Tang)

In the above mentioned reference, the adequate luminance of 100 cd/m$^2$ is achieved at 5.5 V by making the thickness of an organic thin film uniform with ultra-thin film thickness of around 100 nm, selecting an electrode material so as to reduce a carrier injection barrier relative to the organic thin film, and further introducing a hetero structure (a double structure) as shown in FIG. 9.

Also, it can be said that the organic light emitting element described in the reference 1 is based on, so to speak, (a starting point of) thought of functional separation of layers in which a hole transporting layer is assigned to transport holes, and an electron transporting luminescent layer is assigned to transport electrons and emits light. Such concept of functional separation has further grown to a concept of double heterostructure (three-layered structure) in which a light emitting layer is disposed between the hole transporting layer and the electron transporting layer (Referred to non-patent literature 2: Chihaya ADACHI et al, "Electroluminescence in Organic Films with Three-Layer Structure", Japanese Journal of Applied Physics, Vol. 27, No. 2, p. L269-L271 (1988)). The double heterostructure has greatly high luminous efficiency and is employed in almost all light emitting devices that are under development now.

An organic light emitting element disclosed in non-patent literature 1 is shown in FIG. 9. The organic light emitting element is composed of a substrate 901, an anode 902, a hole transporting layer 903, an electron transporting light emitting layer 904, and a cathode 905.

Light emitted from the electron transporting light emitting layer 904 passes through the hole transporting layer 903, the anode 902, and the glass substrate 901, and is obtained.

When the light passes through an interface among substances having different refractive indexes respectively, phenomena such as refraction and reflection are occurred at the interface. In addition, larger the difference in the refractive indexes among the substances is, more light is reflected at the interface.

In a light emitting device having an organic compound, transparent conductive films which are used as transparent electrodes such as indium oxide tin oxide alloy (ITO), indium oxide zinc oxide alloy (In$_2$O$_3$—ZnO), zinc oxide (ZnO)) are given a refractive index of approximately 2.0, and glass (glass such as alkali glass and quartz glass in which a compound of oxygen and silicon is in major proportions) used as a general substrate is given a refractive index of approximately 1.5. The ITO (indium oxide tin oxide alloy) is used as a transparent conductive film for the anode in the organic light emitting element in FIG. 9.

The refractive index of ITO is approximately 2.0, while the refractive index of glass is approximately 1.5. Therefore, it can be seen that the refractive index of the ITO greatly varies from that of the glass substrate. And some of light emitted from the interface between the ITO and the glass substrate is reflected without passing through.

As described above, in order to extract light from the light emitting layer to the outside of the light emitting device, the light has to pass through the interfaces of the inside of the light emitting device. And reflection of the light is generated in the interfaces thereof, thereby reducing light exterior extraction efficiency.

SUMMARY OF THE INVENITON

Accordingly, it is an object of the present invention to provide a light emitting device with higher light extraction efficiency, lower consumption, longer operation life, and higher reliability, and a manufacturing method thereof.

A light emitting device of the present invention comprises a substrate having an insulating surface; a transparent film formed over the substrate having the insulating surface; a first electrode formed over the transparent film; a layer including an organic compound formed over the first electrode; and a second electrode formed over the layer including the organic compound, wherein a refractive index of the transparent film sequentially varies from an interface at the side of the substrate having the insulating surface to an interface at the side of the first electrode.

A light emitting device of the present invention comprises a substrate having an insulating surface; a first electrode formed over the substrate having the insulating surface; a layer including an organic compound formed over the first electrode; a second electrode formed over the layer including the organic compound; and a transparent film formed over the second electrode, wherein a refractive index of the transparent film sequentially varies from an interface at the side of the second electrode in the film thickness direction.

A light emitting device of the present invention comprises a substrate having an insulating surface; a transparent film formed over the substrate having the insulating surface; a first electrode formed over the transparent film; a layer including an organic compound formed over the first electrode; and a second electrode formed over the layer including the organic compound, wherein the transparent film is formed of plural substances including a first substance and a second substance; and wherein the composition ratio of the second substance to the first substance sequentially varies from an interface at the side of the substrate having the insulating surface to an interface at the side the first electrode.

A light emitting device of the present invention comprises a substrate having an insulating surface; a first electrode formed over the substrate having the insulating surface; a layer including an organic compound formed over the first electrode; a second electrode formed over the layer including the organic compound; and a transparent film formed over the second electrode, wherein the transparent film is formed of plural substances including a first substance and a second substance; and wherein the composition ratio of the second substance to the first substance sequentially varies from an interface at the side of the second electrode in the film thickness direction.

In this specification, a transparent film is a film which does not absorb light in the film, but transmits light exteriorly. Further, in the above mentioned structure, the transparent film has a refractive index distribution in the film. The refractive index of the transparent film varies from an interface to another interface in the film thickness direction sequentially.

The substances which constitute a light emitting device each have a particular refractive index. Light is reflected at the interface of substances having different refractive indexes. By the use of the transparent film in the present invention, the refractive index distribution of the transparent film can be varied in succession by reducing the difference in the refractive indexes at the interface, thereby reducing reflection of light at the interface. Therefore, the light emitting device having higher light exterior extraction efficiency can be obtained.

According to the above-mentioned structure, the transparent film is preferably formed so that the refractive index in the transparent film sequentially increases or decreases in the film thickness direction with the refractive indexes of the substances each having an interface. For example, the transparent film is preferably formed so that the refractive index of the transparent film sequentially increases from an interface at the side of the substance having lower refractive index to an interface at the side of the substance having higher refractive index.

The refractive index of the transparent film may be changed by any means and methods. For instance, in the case where the transparent film is formed of plural substances at least including a first substance and a second substance, the refractive index may be varied in succession by changing the composition of the substances successively.

Further, for example, a silicon oxynitride film is used as the transparent film, and the first substance is to be oxygen and the second substance is to be nitrogen. Then the composition ratio may be changed in order to change the refractive index in the transparent film.

A method for manufacturing a light emitting device of the present invention comprises the steps of forming a transparent film over a substrate having an insulating surface; forming a first electrode over the transparent film; forming a layer including an organic compound over the first electrode; and forming a second electrode over the layer including the organic compound, wherein the transparent film is formed so that the refractive index of the transparent film varies successively from an interface at the side of the substrate having the insulating surface to an interface at the side of the first electrode.

A method for manufacturing a light emitting device of the present invention comprises the steps of: forming a first electrode over a substrate having an insulating surface; forming a layer including an organic compound over the first electrode; forming a second electrode over the layer including the organic compound; and forming a transparent film over the second electrode, wherein the transparent film is manufactured so that the refractive index of the transparent film varies successively form an interface at the side of the second electrode in the film thickness direction.

A method for manufacturing a light emitting device of the present invention comprises the steps of: forming a transparent film over a substrate having an insulating surface; forming a first electrode over the transparent film; forming a layer including an organic compound over the first electrode; and forming a second electrode over the layer including the organic compound, wherein the transparent film is formed of plural substances at least including a first substance and a second substance, and the transparent film is formed so that the composition ratio of the second substance to the first substance varies successively from an interface at the side of the substrate having the insulating surface to an interface at the side of the first electrode.

A method for manufacturing a light emitting device of the present invention comprises the steps of: forming a first electrode over a substrate having an insulating surface; forming a layer including an organic compound over the first electrode; forming a second electrode over the layer including the organic compound; and forming a transparent film over the second electrode, wherein the transparent film is formed of plural substances including at least a first substance and a second substance, and the transparent film is formed so that the composition ratio of the first substance and the second substance varies successively from an interface at the side of the second electrode in the film thickness direction.

In this specification, a transparent film is a film which does not absorb light in the film, but transmits light exteriorly. Further, in the above mentioned method, the transparent film has a refractive index distribution in the film, and is formed so that the refractive index of the transparent film sequentially varies from an interface to the other interface in the film thickness direction.

The substances which constitute a light emitting device each have a particular refractive index. Light is reflected at the interface of substances having different refractive indexes, respectively. By forming the transparent film, and reducing the difference in the refractive indexes at the interface according to the present invention, the refractive index distribution in the transparent film can be varied in succession, thereby reducing reflection of light at the interface. Therefore, the light emitting device having higher light exterior extraction efficiency can be manufactured.

According to the above-mentioned structure, the transparent film is preferably formed so that the refractive index in the transparent film sequentially increases or decreases in the film thickness direction with the refractive index of the substances each having an interface. For example, the transparent film is preferably formed so that the refractive index of the transparent film sequentially increases from an interface at the side of the substance having a lower refractive index to an interface at the side of the substance having a higher refractive index.

The refractive index of the transparent film may be changed by any means and methods. For instance, in the case where the transparent film is formed of plural substances at least including a first substance and a second substance, the refractive index may be varied in succession by changing the composition of the substance successively.

Further, for example, a silicon oxynitride film is used as the transparent film, and the first substance is to be oxygen and the second substance is to be nitrogen. Then the composition ratio may be changed in order to change the refractive index in the transparent film.

Accordingly, a light emitting device with lower consumption, longer operation life, and higher reliability, and a manufacturing method thereof can be obtained since light extraction efficiency can be improved.

There are two kinds of luminescence in the layer including an organic compound: the one is luminescence (fluorescence), generated by returning to a ground state from a excited singlet state and the other is luminescence (phosphorescence) generated by returning to a ground state from a excited triplet state. It is possible to apply both types of luminescence to the light emitting device manufactured according to the present invention.

The layer including the organic compound may have a laminate structure. Examples of the laminate structures in which: a hole transporting layer/a light emitting layer/an electron transporting layer are laminated in this order on an anode; a hole injecting layer/a hole transporting layer/a light emitting layer/an electron transporting layer are laminated in this order on an anode; or a hole injecting layer/a hole transporting layer/a light emitting layer/an electron transporting layer/an electron injecting layer are laminated in this order may be applied. Fluorescent pigments and the like may be doped into the light emitting layers. Further, the layers may be formed using low-molecular weight materials, or high-molecular weight materials.

Note that all the layers formed between a cathode and an anode are referred to generically as EL layers in this specification. The aforementioned hole injecting layer, hole transporting layer, light emitting layer, electron transporting layer, and electron injecting layer are therefore all included in the category of the EL layers.

Further, a light emitting element formed using a cathode, an EL layer, and an anode is referred to as an EL element in this specification. There are two types for the EL element: the first is a passive matrix type where an EL layer is formed between two kinds of stripe-shaped electrodes provided so as to be orthogonal to each other; and the second is an active matrix type where an EL layer is formed between a pixel electrode and the counter electrode which are connected to switching elements typified by a thin film transistor (TFT) and are arranged in a matrix.

Further, the light emitting device in the specification includes an image display device, a light emitting device or a light source (including lighting installation). Further, a light emitting device includes a module attached to the light emitting device with a connector, for example, FPC (Flexible Printed Circuit), TAB (Tape Automated Bonding) tape or TCP (Tape Carrier Package), a module provided with a wiring circuit board at a front end of TAB tape or TCP, and a module in which a light element is directly mounted with an IC (Integrated Circuit) by a COG (Chip On Glass) method.

These and other objects, features and advantages of the present invention will become more apparent upon reading of the following detailed description along with the accompanied drawings.

DESCRIPTION OF THE PREFFERRED EMBODIMENTS

Embodiment Mode

The embodiment modes of the present invention are described with drawings as follows. However, it is easily understood by those skilled in the art that the invention is not limited to the following description, and various changes and modification will be apparent without departing from the purpose and the scope of the invention. Therefore, the present invention is not interpreted while limiting to the following description. Note that the same symbol is used to the one that indicates the same among the different drawings in the structure of the invention described as follow.

Embodiment Mode 1

Figure 1:
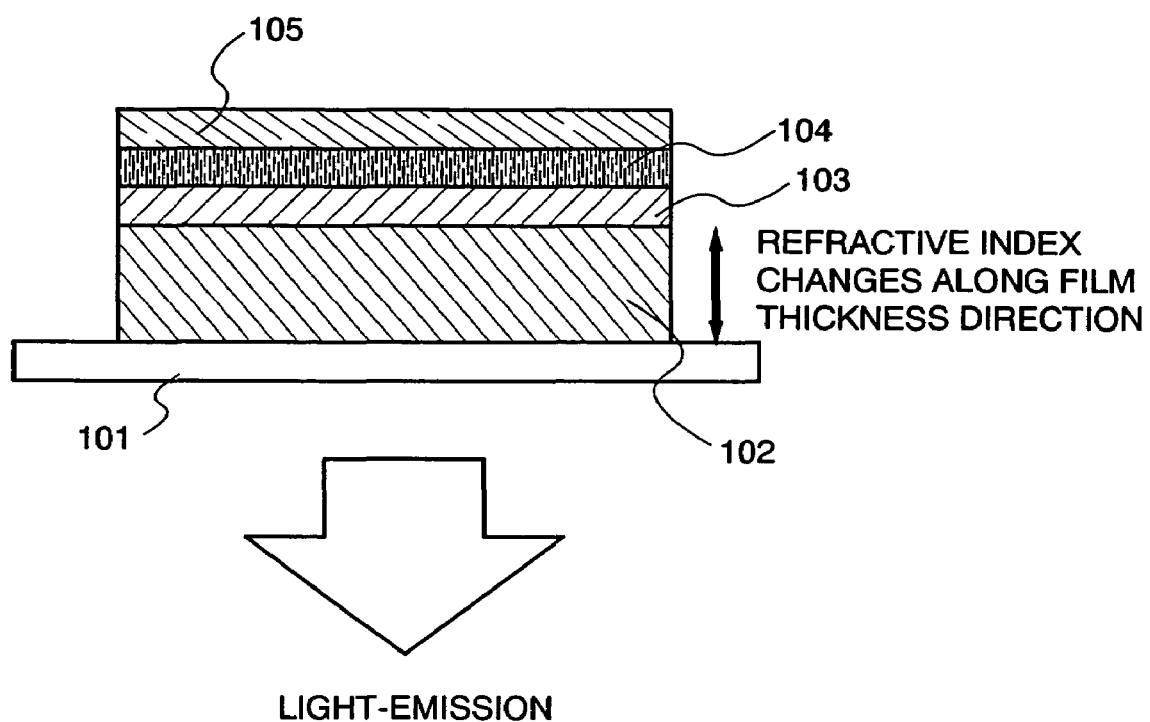
FIG. 1 is a diagram showing a cross-sectional structure of a light emitting device of the present invention.

FIG. 1 shows a schematic diagram of the present invention. In a light emitting device of FIG. 1, a transparent film 102, a first electrode 103, a light emitting layer 104, and a second electrode 105 are sequentially laminated from a side of a substrate 101. In this embodiment mode, light generated in the light emitting layer 104 is exteriorly taken out from the side of the substrate 101. Therefore, the transparent conductive film which transmits light is used as the first electrode 103. A glass (glass such as alkali glass and quartz glass in which a compound of oxygen and silicon is in major proportions) generally used as a substrate can be used as the substrate 101. In addition, a plastic substrate formed of FRP (Fiberglass-Reinforced Plastics), PVF (polyvinyl fluoride), Mylar, polyester, acrylic, etc. can be used as the substrate 101. The transparent conductive film may be an ITO (indium tin oxide alloy) film, an indium oxide-zinc oxide alloy ($In_2O_3$—ZnO) film, a zinc oxide (ZnO) film, or the like.

The transparent film 102 is sandwiched between the substrate 101 and the first electrode 103, and has the sequential refractive index distribution in the film thickness direction. In this embodiment mode, a film formed of plural substances at least including a first substance and a second substance is used as the transparent film 102, and the refractive index is changed according to the variation of the composition ratio of the substances.

In this embodiment mode, the composition ratio of a second substance to a first substance in the transparent film 102 is sequentially varied from an interface at the side of the substrate 101 to an interface at the side of the first electrode 103 in the film thickness direction. Therefore, the refractive index of the transparent film 102 is also varied from the interface at the side of the substrate 101 to the interface at the side of the first electrode 103 in the film thickness direction according to the variation of the composition ratio.

By using a film including the first substance and having the almost similar refractive index as the substrate 101, the transparent film 102 in the vicinity of the interface of the substrate 101 is to have the smaller composition ratio of the second substance to the first substance (that is a film almost made of the first substance), thereby reducing the difference in the refractive indexes at the interface of the substrate 101 and the transparent film 102 and reducing the reflection of light at the interface. In addition, by using the film including the second substance and having the almost similar refractive index as the first electrode, the transparent film 102 in the vicinity of the interface of the first electrode 103 is to have the larger composition ratio of the second substance to the first substance (that is a film almost made of the second substance), thereby reducing the difference in the refractive index at the interface of the first electrode 103 and the transparent film 102 and reducing the reflection of light at the interface.

The refractive index of the transparent film may be changed by any means and any methods. Either of an insulating film or a conductive film may be used for the transparent film. The transparent film is required to form regions having the similar refractive indexes as the substrate 101 and the first electrode 103 respectively in the film by changing the composition of the plural substances including the first and second substances for forming the transparent film. Smaller the difference in the refractive indexes is, less the reflection at the interface becomes, thereby preferably improving the light extraction efficiency.

For example, in the case of using the before mentioned glass to the substrate 101 and using the transparent conductive film (ITO) to the first electrode, the refractive index of the glass is to be approximately 1.5, and the refractive index of ITO is to be approximately 2.0. A silicon oxynitride film which can form regions having refractive indexes of the 1.5 and 2.0 and which is transparent is preferably used.

The silicon oxynitride film may be a film including oxygen as the first substance and nitrogen as the second substance. The refractive index of the silicon oxide is approximately 1.5 and that of the silicon nitride is approximately 2.0. Therefore, regions having the refractive indexes that are almost equivalent to the substrate 101 and the first electrode 103 respectively can be formed by changing the composition ratio of oxygen and nitrogen in the silicon oxynitride film.

The composition ratio of oxygen and nitrogen in the silicon oxynitride film may be changed so that the region in the vicinity of the interface with the substrate 101 shall be almost silicon oxide film, and the region in the vicinity of the interface with the first electrode 103 shall be almost silicon nitride film.

Since the reflection of light at the interface of the substances each having the similar refractive index respectively is reduced, the light generated in the light emitting layer 104 can be effectively taken out from the light emitting device. Accordingly, a light emitting device with lower consumption, longer operation life, and higher reliability can be obtained since higher light extraction efficiency can be obtained.

The materials for the transparent film 102, the first substance and the second substance are not limited to these in this embodiment mode, and may be properly decided by the operator according to the refractive indexes of the substrate 101 and the first electrode 103.

Embodiment Mode 2

The embodiment mode of the present invention is described with reference to the drawings as below. This embodiment mode has a different structure of a transparent film comparing to that of the transparent film in Embodiment Mode 1.

Figure 10:
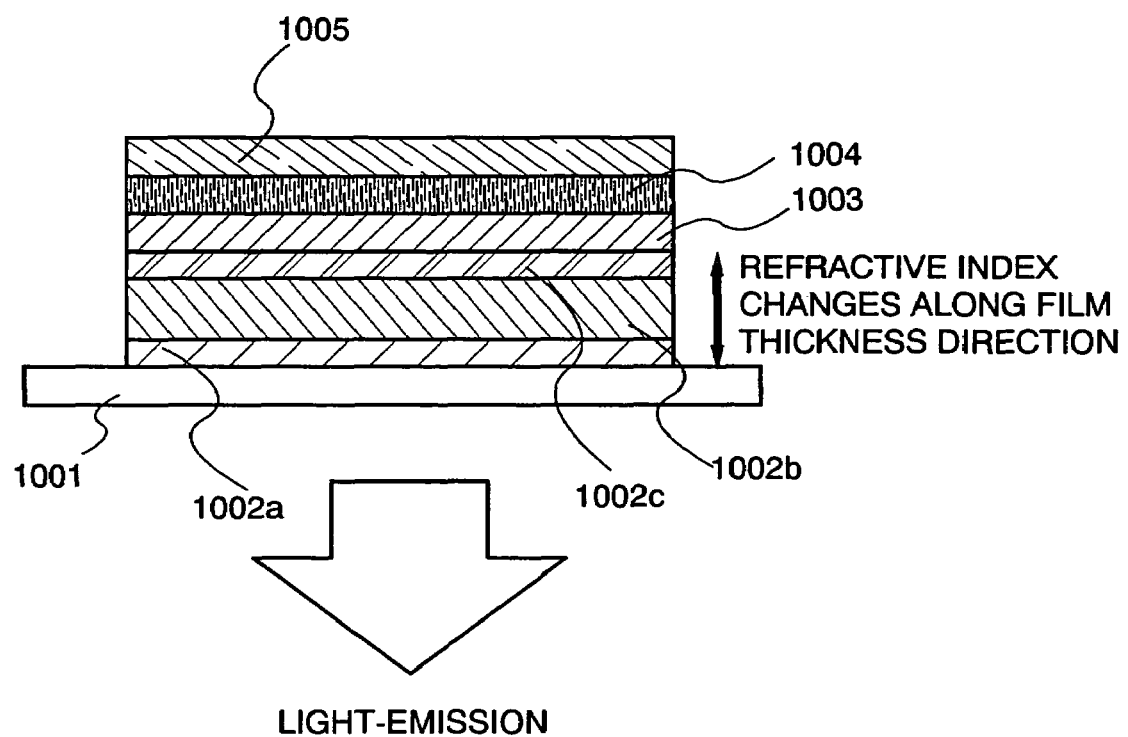
FIG. 10 is a diagram showing a cross-sectional structure of a light emitting device of the present invention.

FIG. 10 shows a schematic diagram of the present invention. A transparent film 1002, a first electrode 1003, a light emitting layer 1004, and a second electrode 1005 are sequentially laminated from the side of a substrate 1001 in a light emitting device of FIG. 10. In this embodiment mode, the light generated in the light emitting layer 1004 is emitted from the side of the substrate 1001 and exteriorly taken out. Therefore, a transparent conductive film that transmits light is used as the first electrode 1003. A glass (glass such as alkali glass and quartz glass in which a compound of oxygen and silicon is in major proportions) generally used as a substrate can be used as the substrate 1001. In addition, an ITO (indium tin oxide alloy) film, an indium oxide-zinc oxide alloy ($In_2O_3$—ZnO) film, a zinc oxide (ZnO) film, or the like can be used as the transparent conductive film.

The transparent conductive film 1002 has sequential refractive index distribution in the film thickness direction. In this embodiment mode, a film formed of plural substances including at least a first substance and a second substance are used as the transparent film 1002, and the refractive index is changed according to the variation of the composition ratio of the substances.

The transparent film 1002 is sandwiched between the substrate 1001 and the first electrode 1003. A film 1002a including the first substance and a film 1002b including the first and the second substances and a film 1002c including the second substance are sequentially laminated from the side of the substrate 1001. In the film 1002b including the first and the second substances, the composition ratio of the second substance to the first substance sequentially increases from the interface with the film 1002a having the first substance to the interface with the film 1002c having the second substance in the film thickness direction.

Therefore, the refractive index of the film 1002b including the first and the second substances is also varied similarly according to the variation of the composition ratio in the film thickness direction from an interface with the film 1002a having the first substance to an interface with the film 1002c having the second substance.

As is the case with Embodiment Mode 1, the film 1002a including the first substance is to have the refractive index that is almost similar to that of the substrate 1001. And the film 1002c including the second substance is to have the refractive index that is almost similar to that of the first electrode 1003. Accordingly, the reflection of light becomes small since the refractive index at the interface with the film 1002a having the first substance and the substrate 1001 is almost equal and the refractive index at the interface with the film 1002c having the second substance and the first electrode 1003 is almost equal.

Further, in the film 1002b including the first and the second substances, the composition ratio of the second substance to the first substance in the vicinity of the interface with the film 1002a having the first substance is made smaller, thereby reducing the difference in the refractive indexes with approaching to the film 1002c having the second substance, furthermore, the composition ratio of the second substance to the first substance is made larger thereby reducing the difference in the refractive indexes. Consequently, the difference in the refractive indexes at the interface becomes smaller and the reflection of the light is reduced.

The refractive index of the transparent film may be varied in accordance with any means and any methods. And the transparent film may be an insulating film or a conductive film. However, the refractive indexes of the substrate 1001 and the film 1002*a* having the first substance are required to be the same level, and the refractive indexes of the first electrode 1003 and the film 1002*c* having the second substance are required to be the same level. Therefore, the film 1002*b* which is sandwiched between the film 1002*a* having the first substance and the film 1002*c* having the second substance, and which is formed of the mixture of the first and the second substances is required to form regions having similar refractive indexes as the substrate 1001 and the first electrode 1003 respectively in the film by changing the composition of the first and second substances. Smaller the difference in the refractive indexes is, less the reflection at the interface becomes, thereby preferably improving the light extraction efficiency.

For example, in the case of using the glass to the substrate 1001 and using the transparent conductive film (ITO) to the first electrode, the refractive index of the glass is to be approximately 1.5, and the refractive index of ITO is to be approximately 2.0. In this case, a silicon oxide film having the refractive index of approximately 1.5 is used as the film 1002*a* including the first substance, a silicon nitride film having the refractive index of approximately 2.0 is used as the film 1002*c* including the first and the second substances, a silicon oxynitride film that can make regions having the refractive indexes of close to 1.5 and 2.0 is used as the film 1002*b* having the first and the second substances. In addition, each of the silicon oxide film, silicon nitride film, and silicon oxynitride film has a transparency.

The silicon oxynitride film includes oxygen as the first substance and nitrogen as the second substance. The regions having refractive indexes that are almost equal to the refractive indexes of the substrate 1001 and the silicon oxide film, and those of the first electrode 1003 and the silicon nitride film can be formed by changing the composition ratio of oxygen and nitrogen in the silicon oxynitride film.

Accordingly, the reflection of light at the interface of substances each having the similar refractive index is reduced, and light generated in the light emitting layer 1004 can be effectively exteriorly taken out. Since the light extraction efficiency is improved, a light emitting device with lower consumption and longer operation life can be obtained, and the reliability can be improved.

The materials for the transparent film 1002, the first substance, and the second substance are not limited to those in the this embodiment mode, and can be decided by the operator according to the refractive indexes of the substrate 1001 and the first electrode 1003.

The difference in the refractive index at the interface of the substrate 1001 and the first electrode 1003 can be increasingly reduced by forming the film having transparency not only with a layer but with plural layers, and the reflection of light can be increasingly reduced in this embodiment mode.

Embodiment Mode 3

The embodiment mode of the present invention is described with reference to the drawings as below.

Figure 2:
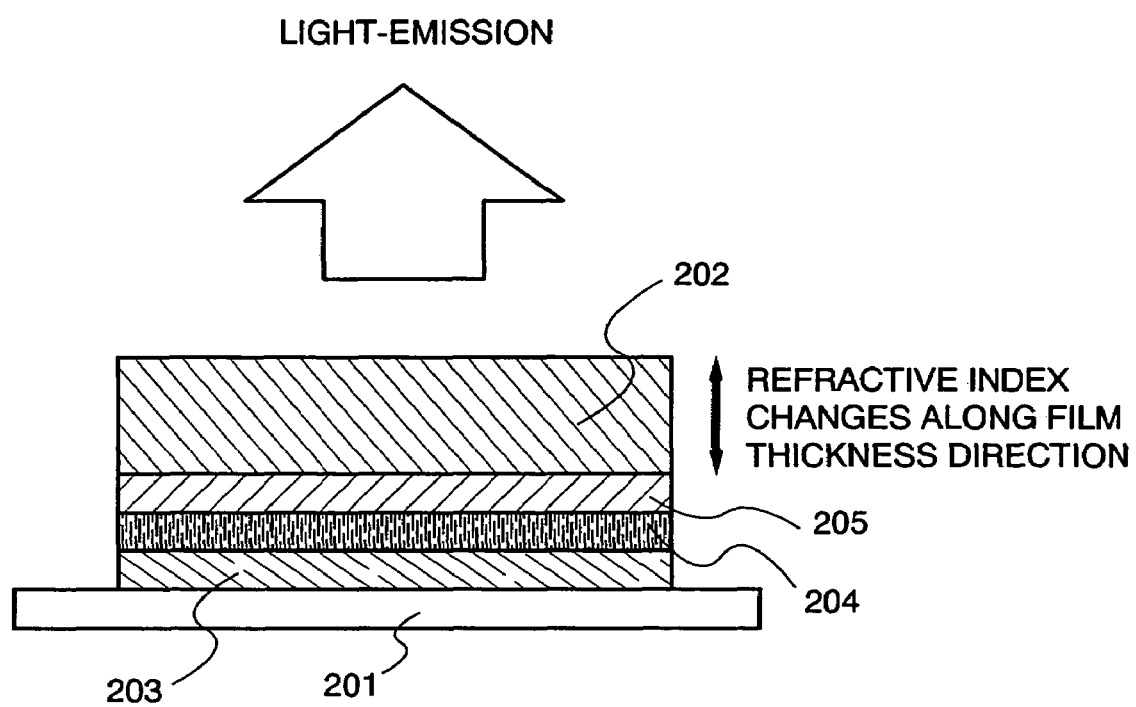
FIG. 2 is a diagram showing a cross-sectional structure of a light emitting device of the present invention.

FIG. 2 shows a schematic view of the present invention. A first electrode 203, a light emitting layer 204, a second electrode 205, and a transparent film 202 are sequentially laminated from the side of a substrate 201 in a light emitting device of FIG. 2. In this embodiment mode, light generated in the light emitting layer 204 is taken out exteriorly through the side of the second electrode 205. Therefore, a transparent conductive film that transmits light is used as the second electrode 205. A glass (glass such as alkali glass and quartz glass in which a compound of oxygen and silicon is in major proportions) generally used as a substrate can be used as the substrate 201. In addition, a plastic substrate formed of FRP (Fiberglass-Reinforced Plastics), PVF (polyvinyl fluoride), Mylar, polyester, acrylic, etc. can be used as the substrate 201. The transparent conductive film may be an ITO (indium tin oxide alloy) film, an indium oxide-zinc oxide alloy ($In_2O_3$—ZnO) film, a zinc oxide (ZnO) film, or the like.

The transparent film 202 has a continuous refractive index distribution in the film thickness direction. In this embodiment mode, a film formed of plural substances at least including the first and the second substances is used as the transparent film 202. And the refractive index is changed according to the variation of the composition ratio of the substances.

The transparent film 202 is in contact with the second electrode 205. Although it is not shown, the substance that is in contact with the interface at the side of the second electrode 205 may be sealed with the counter substrate, or the space between the transparent film and the counter substrate may be injected and sealed with an inert gas, or filled with a resin. Accordingly, the transparent film 202 is formed so as to be in contact with the second electrode 205 in this embodiment mode. The transparent film 202 is a film that includes the first and the second substances. In the transparent film 202, the composition ratio of the second substance to the first substance in the film is sequentially varied from the interface at the side of the second electrode 205 in the film thickness direction.

Accordingly, the refractive index of the transparent film 202 is also varied from the interface at the side of the second electrode 205 in the film thickness direction according to the variation of the composition ratio. By using the film including the first substance and having the almost similar refractive index as the second electrode 205, the transparent film 202 in the vicinity of the interface of the second electrode is to have the smaller composition ratio of the second substance to the first substance (that is a film almost made of the first substance), thereby reducing the difference in the refractive indexes at the interface of the second electrode 205 and the transparent film 202, and reducing the reflection of light at the interface. In addition, by using the film including the second substance, and having the almost similar refractive index as the substance that is in contact with the interface at the opposite side of the second electrode, a part of the transparent film 202 in the vicinity of the interface is to have the larger composition ratio of the second substance to the first substance (that is a film almost made of the second substance), thereby reducing the difference in the refractive indexes at the interface of the substance that is in contact with the interface at the opposite side of the second electrode and the transparent film 202, and reducing the reflection of light at the interface.

The refractive index of the transparent film can be varied according to any means and any methods. Further, the transparent film may be an insulating film or a conductive film. However, the transparent film is required to be a film in which regions having almost similar refractive indexes as the second electrode 205 and the substance that is in contact with the opposite side of the second electrode respectively are formed by changing the composition of the first and the second substances. As the difference in the refractive indexes become smaller, the reflection at the interface is reduced, thereby preferably improving the light extraction efficiency.

For example, a film including nitrogen is formed in the opposite side of the light emission by using the before mentioned transparent conductive film ITO to the second electrode 205. And the refractive index of ITO is approximately 2.0 and the refractive index of the nitrogen is approximately 1.0. A silicon oxynitride film which contains regions having similar refractive indexes between 1 and 2.0 and which is transparent may be used.

The silicon oxynitride film includes nitrogen as the first substance and oxygen as the second substance, and the refractive index of the silicon nitride is approximately 2.0, and the refractive index of the silicon oxide is approximately 1.5. Therefore, a region having almost the same refractive index as the second electrode 205 can be formed by changing the composition ratio of oxygen and nitrogen in the silicon oxynitride film. Further, the difference in the refractive index at the interface with the nitrogen can be reduced by changing the composition ratio.

Namely, the composition ratio of oxygen and nitrogen is changed so that the region in the vicinity of the interface with the second electrode 205 is almost silicon nitride film, and the region in the vicinity of the interface with the substance (nitrogen in this embodiment mode) which is in contact with the interface at the opposite side of the second electrode is almost silicon oxide film.

Since the reflection of light at the interface of substances having similar refractive index each other is reduced, light generated in the light emitting layer 204 can be effectively taken out from the light emitting device. Since higher light extraction efficiency can be obtained, a light emitting device with lower consumption, and longer operation life can be obtained, and reliability can be improved.

Note that the materials for transparent film 202, the first substance, and the second substance are not limited to those in this embodiment mode, and can be properly decided by the operator according to the refractive index of the substance which is in contact with the interface at the opposite side of the second electrode.

Embodiment Mode 4

The embodiment mode of the present invention is described with reference to the drawings. The structure of a transparent film in this embodiment mode is different from the one in Embodiment Mode 3.

Figure 11:
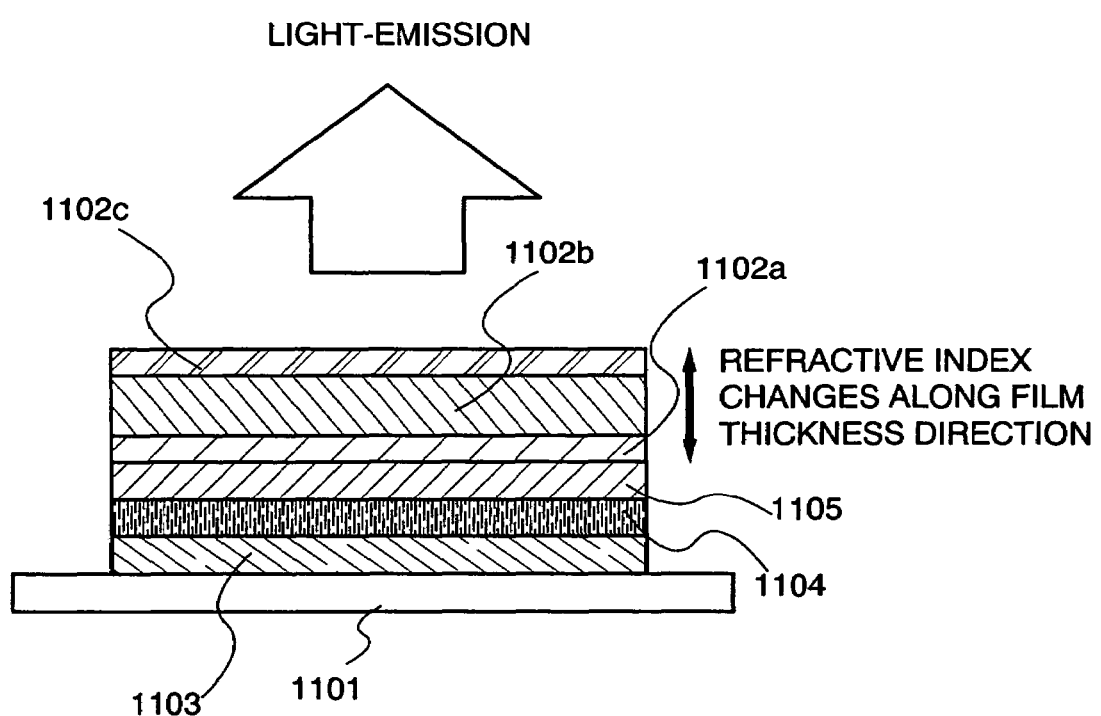
FIG. 11 is a diagram showing a cross-sectional structure of a light emitting device of the present invention.

FIG. 11 shows a schematic view of the present invention. A first electrode 1103, a light emitting layer 1104, a second electrode 1105, and a transparent film 1102 are sequentially laminated from the side of a substrate 1101 in a light emitting device of FIG. 11. In this embodiment mode, light generated from a light emitting layer 1104 passes through the side of the second electrode 1105 and exteriorly taken out. Therefore, a transparent conductive film which transmits light is used for the second electrode 1105. A glass (glass such as alkali glass and quartz glass in which a compound of oxygen and silicon is in major proportions) generally used as a substrate can be used as the substrate 1101. Alternatively, a plastic substrate formed of FRP (Fiberglass-Reinforced Plastics), PVF (polyvinyl fluoride), Mylar, polyester, acrylic, etc. can be used as the substrate 1101. The transparent conductive film may be an ITO (indium tin oxide alloy) film, an indium oxide-zinc oxide alloy ($In_2O_3$—ZnO) film, a zinc oxide (ZnO) film, or the like.

The transparent film 1102 has the sequential refractive index distribution in the film thickness direction. A film containing plural substances including the first and the second substances is used for the transparent film 1102, and the refractive index is changed according to the variation of the composition ratio of the substances.

The transparent film 1102 is in contact with the second electrode 1105. A film 1102a including the first substance, a film 1102b including the first and the second substances, and a film 1102c including the second substance are sequentially laminated from the side of the second electrode 1105. Although it is not shown, the substance which is in contact with the interface at the opposite side of the second electrode 1105 in the transparent film 1102 may be sealed with a counter substrate, and the space between the transparent film and the counter substrate may be injected and sealed with an inert gas, or filled with a resin or the like. Thus, the transparent film 1102 is preferably formed so as to be in contact with the second electrode 1105. The transparent film 1102a is the one including the first and second substances. The composition ratio of the second substance to the first substance in the film 1102b including the first and the second substances is increased from the interface with the film 1102a having the first substance to the interface with the film 1102c having the second substance.

Therefore, the refractive index of the film 1102b including the first and the second substances is also changed in the film thickness direction from an interface with a film 1102a including the first substance to an interface with a film 1102c including the second substance according to the variation of the composition ratio.

As is the case with Embodiment Mode 3, the film 1102a including the first substance is to have the nearly equivalent refractive index as that of the second electrode 1105. And the film 1102c including the second substance is to have the nearly equivalent refractive index as that of the substance that is in contact with the opposite side of the second electrode. Accordingly, since the refractive index at the interface of the film 1102 including the first substance and the second electrode 1105 are nearly equivalent; the reflection of light is reduced. In addition, since the refractive index at the interface of the film 1102c including the second substance and the substance which is in contact with the interface at the opposite side are nearly equivalent, the reflection of light is reduced.

In the film 1102b including the first and the second substances, the composition ratio of the second substance to the first substance is reduced in the vicinity of the interface with the film 1102a including the first substance, and the difference in the refractive indexes are reduced. The composition ratio is changed with approaching to the film 1102c including the second substance, and the composition ratio of the second substance to the first substance in the vicinity of the interface with the film 1102c including the second substance is increased, thereby reducing the difference in the refractive indexes. Consequently, the difference in the refractive indexes at the each interface becomes smaller, and the reflection of light is reduced.

The refractive index of the transparent film may be changed according to the any means and any methods. And the transparent film may be an insulating film or a conductive film. However, the refractive index of the second electrode 1105 and the film 1102a including the first substance are required to be the similar level, and the refractive index of the substance which is in contact with the interface at the opposite side of the second electrode and the film 1002 including the second substance are required to be the similar level. Smaller the difference in the refractive indexes is, less the reflection at the interface becomes, thereby preferably improving the light extraction efficiency.

For instance, in the case that nitrogen is sealed into the interface at the side of the one from which light is emitted by using the transparent conductive film for the second electrode 1105, the refractive index of ITO is to be approximately 2.0, and that of nitrogen is to be approximately 1.0. In this case, a silicon nitride film having a refractive index of approximately 2.0 may be used as the film 1102a including the first substance, a silicon oxide film having a refractive index of approximately 1.5 may be used as the film 1102c including the second substance, and a silicon oxynitride film in which regions having refractive indexes of approximately 1.5 and 2.0 may be respectively formed may be used as the film 1102b including the first and the second substances. In addition, each of the silicon oxide film, silicon nitride film, and silicon oxynitride film has a transparency.

The silicon oxynitride film is the one including nitrogen as the first substance and oxygen as the second substance. Therefore, by changing the composition ratio of the nitrogen and oxygen in the silicon oxynitride film, regions having refractive indexes that are nearly equivalent to that of the second electrode 1105 and silicon nitride film, the substance that is in contact with the interface at the opposite side of the second electrode and the silicon oxide film can be formed respectively.

Since the reflection of light is reduced at the interface between the substances each having the similar refractive index, light generated from the light emitting layer 1104 can be efficiently taken out exteriorly. Since higher light extraction efficiency can be obtained, a light emitting device with lower consumption, and longer operation life can be obtained, and reliability can be improved.

Note that the materials for the transparent film 1102, the first substance, and the second substance are not limited to those in this embodiment mode. And the operator can decide the respective materials according to the refractive index of the second substance 1105, and that of the substance that is in contact with the interface at the opposite side of the second electrode.

According to this embodiment mode, a transparent film is formed of not a layer of a film but plural films. Therefore, the difference in the refractive indexes at the interface of the substances which are in contact with the interface of the second electrode 1105, and the opposite side of the second electrode can be reduced, and moreover, the reflection of light can be further reduced.

EMBODIMENT

Embodiment 1

Figure 3:
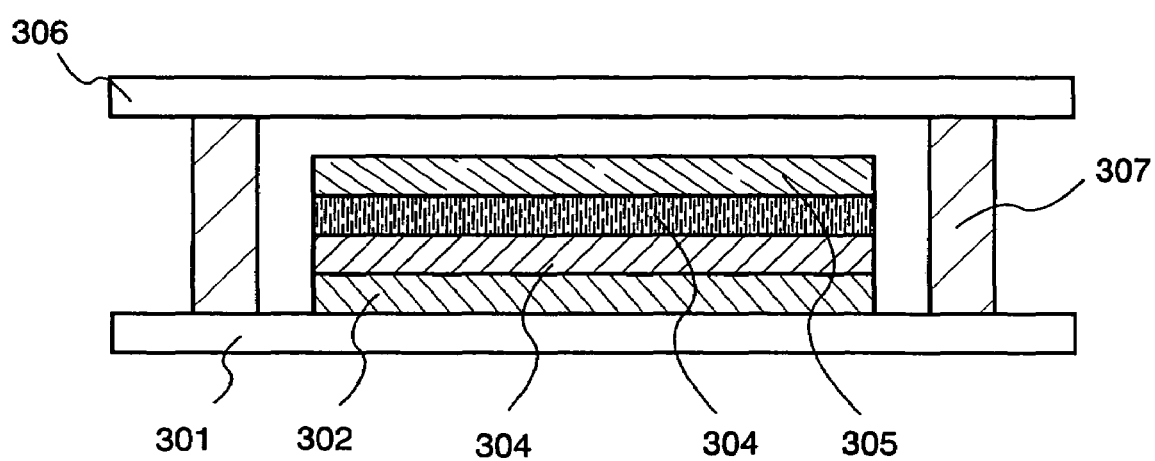
FIG. 3 is a diagram showing a cross-sectional structure of a light emitting device of the present invention.

A structure of a light emitting device of the present invention is described with reference to FIG. 3. A film in which a refractive index is varied in the film thickness direction is formed as a transparent film 302 over a substrate 301 having an insulating surface by means of sputter deposition equipment. In this embodiment, a silicon oxynitride film including nitrogen, oxygen, and silicon is formed as the transparent film 302. Further, nitrogen is used as a first substance and oxygen is used as a second substance, and the refractive index in the transparent film is changed by the variation of the composition ratio. Note that the materials for the transparent film 302, the first substance, and the second substance are not limited to those in this embodiment, and can be decided by the operator according to the refractive ratio of the substrate 301 and the first electrode 303. A glass (glass such as alkali glass and quartz glass in which a compound of oxygen and silicon is in major proportions) generally used as a substrate can be used as the substrate 301. Alternatively, a plastic substrate formed of FRP (Fiberglass-Reinforced Plastics), PVF (polyvinyl fluoride), Mylar, polyester, acrylic, etc. can be used as the substrate 301. A glass substrate is used in this embodiment.

Silicon is used as a target for sputtering. The electric current source can be direct current (DC) or alternating current (AC) for sputtering. Argon, oxygen, and nitrogen can be used as the gas for sputtering. The flow rate of nitrogen is gradually increased from 0 sccm to 30 sccm, and the flow rate of oxygen is gradually reduced from 30 sccm and to 0 sccm, thereby forming the silicon oxynitride. By changing the proportion of silicon oxide and silicon nitride in a growing film, the silicon oxynitride film in which the composition of nitrogen and oxygen is sequentially changed is formed.

Further, the flow rate of nitrogen is set to 0 sccm and the flow rate of oxygen is set to 30 sccm so as to form a silicon oxide film, then the flow rate is changed so as to form a silicon oxynitride film, and then, the flow rate of nitrogen is set to 30 sccm and the flow rate of oxygen is set to 0 sccm so as to form a silicon nitride film.

A fabrication method for silicon oxynitride film formed of nitrogen and silicon may be as follows. Two targets of silicon oxide and silicon nitride are used in sputter deposition equipment. The electric current source for sputtering can be direct current (DC) or alternating current (AC). The electric power of the silicon nitride target is increased from 0 W to 3 kW, and the electric power of the silicon oxide target is reduced from 3 kW to 0 W. thereby forming the silicon oxynitride film. By changing the proportion of silicon oxide and silicon nitride in a growing film, the silicon oxynitride film in which the composition of nitrogen and oxygen is sequentially changed is formed.

As an alternative, electric power of silicon nitride target is set to 0 W and electric power of silicon oxide target is set to 3 kW so as to form a silicon oxide film, then, the electric power is changed so as to form a silicon oxynitride film, and then, the electric power of silicon nitride target is set to 3 kW and the electric power of silicon oxide is set to 0 kW so as to form a silicon nitride film.

In a light emitting device of this embodiment, the difference in the refractive index of the silicon oxide and glass, and of transparent conductive film and silicon nitride is small. Therefore, the reflection of light at respective interfaces is also reduced. Further, with changing the composition ratio of nitrogen and oxygen in the silicon oxynitride film sequentially, the refractive index is also changed accordingly. Therefore, the reflection of light is reduced. And, light exterior extraction efficiency can be improved.

The first electrode 303 is formed over the transparent film 302. A transparent conductive film is used as the material of the first electrode 303. ITO (indium tin oxide alloy), indium oxide-zinc oxide alloy ($In_2O_3$—ZnO), zinc oxide (ZnO), or the like is used for the transparent conductive film. Furthermore, the ITO (indium tin oxide alloy) with 0.1 to 10 wt % of $SiO_2$, or ITO with 0.1 to 10 wt % of ZnO may me used instead. The surface of the ITO film with 0.1 to 10 wt % of $SiO_2$ is flattened progressively, thereby, preventing short circuit in the gap between the two electrodes from occurring. In this embodiment, the ITO is used. The first electrode is formed by sputtering, vacuum deposition, or the like, and patterned by photolithography.

A light emitting layer 304 is formed over the first electrode 303. The light emitting layer 304 may be a single layer structure or a laminated structure; however, luminous efficiency is higher when using the laminated structure. A structure in which a hole injecting layer, a hole transporting layer, a light emitting layer, and an electron transporting layer are laminated in order on the first electrode 303 can be given as a typical example. Further, a structure in which a hole transporting layer, a light emitting layer, and an electron transporting layer are laminated in order on the first electrode 303; or a hole injecting layer, a hole transporting layer, a light emitting layer, an electron transporting layer, and an electron injecting layer are laminated in order on the first electrode 303 may also be used. The present invention can use any one of the above mentioned known structures. Further, fluorescent pigments may be doped into the light emitting layer 304. Further, EL materials used for the light emitting layer 304 may be any one of high molecular weight materials or low molecular weight materials, or electron transporting or hole transporting inorganic compound materials may be dispersed in the low molecular weight or high molecular weight organic compound materials.

A second electrode 305 is formed on the light emitting layer 304. A metal with a low work function, typically an element which belongs to group 1 or group 2 of the periodic table (magnesium, lithium, potassium, barium, calcium, sodium, or beryllium) or a metal with a work function similar to that of element in the group 1 or group 2 is used as the material of the second electrode 305. Further, aluminum, silver, chromium or the like is used as a material of the second electrode, and lithium fluoride or lithium acetylacetonate complex may be formed below aluminum as a buffer layer of the second electrode.

An adhesive material 307 is placed around the region where EL elements are located with a shape of a closed curve. An EL display device wherein the counter substrate 306 has a concave portion may be used, and it is effective to seal a hygroscopic substance in the concave portion. A container inwardly including the hygroscopic substance is adhered to the counter substrate as the means for encapsulating the hygroscopic substance. The container is to be formed of a substance through which moisture passes, but not a hygroscopic substance. As the material for the hygroscopic substance, for example, alkaline metal oxide, alkali earth metal oxide, sulfate, metal halide, or perchlorate is used.

In addition to a glass substrate and a quartz substrate which are used as materials to constitute the counter substrate 306, a plastic substrate formed of FRP (Fiberglass-Reinforced Plastics), PVF (polyvinyl fluoride), Mylar, polyester, acrylic, etc. can be used.

The counter substrate 306 and the substrate 301 on which the light emitting element is formed are bonded together. As to a method for bonding, marks are made in the counter substrate 306 and the substrate 301; positional alignment is performed by using a CCD (charge coupled device) camera, and thereby bonding the substrates. Bonding is performed within an inert gas (nitrogen or a noble gas) atmosphere in order to fill a closed space in which the light emitting element is encapsulated, with an inert gas. The moisture concentration within the atmosphere is reduced to be as low as possible. Specifically, it is desirable that the moisture concentration be equal to or less than 1 ppm.

The adhesive material 307 is hardened after bonding the substrate 301 and the counter substrate 306. The adhesive material 307 is hardened by thermal pressing if it is a heat-curable resin, or by ultraviolet irradiation with an ultraviolet lamp if the adhesive material is a photo-curable resin. It is necessary to exert caution in either case in order not to damage the EL element in hardening.

A crack is then formed along the line where the substrate 301 and the counter substrate 306 are separated, by using a scriber after hardening of the adhesive material is completed. A force is then applied from the opposite surface of the surface in which the crack is formed, to perform cutting into a desired size. An apparatus that applies a pressure and is referred to as a brake machine may also be used at this time.

As described above, a light emitting device as described in this embodiment has an effect of obtaining higher light extraction efficiency and a clear display.

Embodiment 2

Figure 4A:
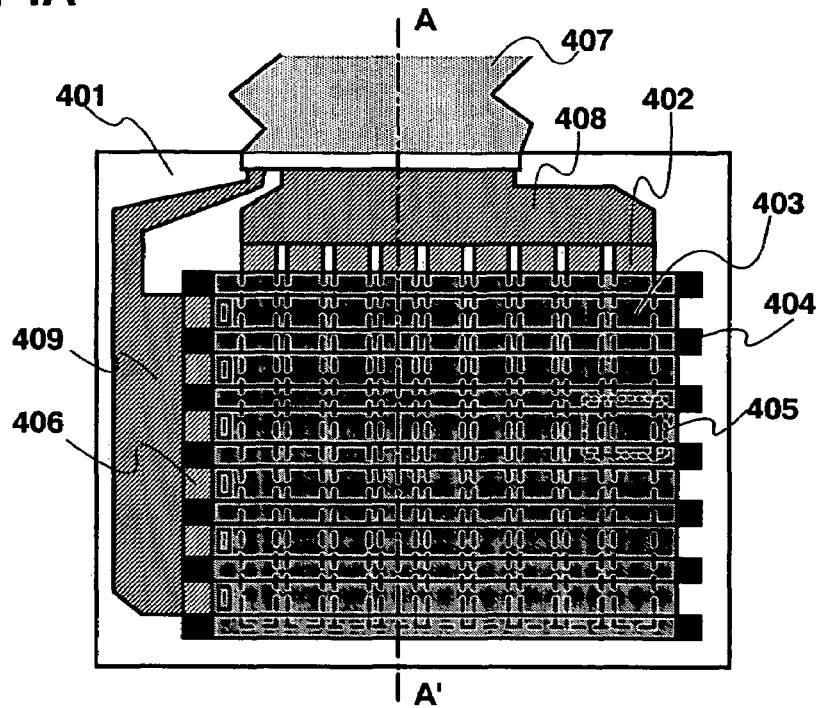
FIGS. 4A to 4C are diagrams showing a cross-sectional structure of an active type light emitting device of the present invention.
Figure 4B:
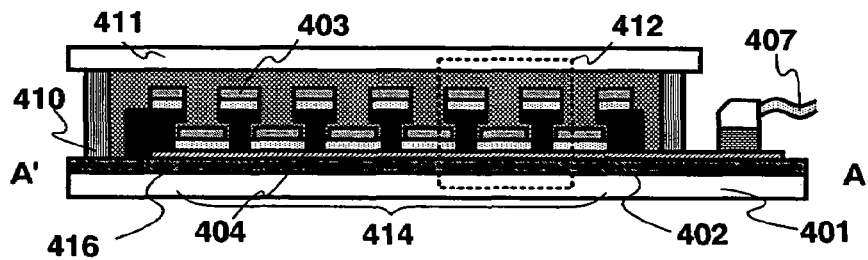

In this embodiment, a passive matrix type light emitting device is illustrated as an example of a light emitting device disclosed in the present invention. FIG. 4A shows the top view of the light emitting device and FIG. 4B shows the cross sectional view taken along line A-A' of FIG. 4A.

Reference numeral 401 refers to a substrate, and glass is used as the substrate 401 in FIG. 4A in this embodiment.

A film in which a refractive index is varied in the film thickness direction is formed as a transparent film 416 over the substrate 401. A silicon oxynitride film in which the composition of nitrogen and oxygen is sequentially varied is formed as the transparent film 416. The transparent film 416 is formed by a method described in Embodiment 1.

Reference numeral 402 denotes a scanning line (a first electrode) formed from a conductive film. In this embodiment, ITO is used as a transparent conductive film. Reference numeral 403 denotes a data line (a second electrode) formed from a metal film, and a lamination of $CaF_2$ and Al is used in this embodiment. Reference numeral 404 denotes a bank formed of an acrylic resin. The bank function as a partition wall that separate the data line 403 from one another. The scanning line 402 and the data line 403 are respectively formed in stripe patterns and the patterns cross each other at right angles. Though not shown in FIG. 4A, a light emitting layer is sandwiched between the scanning line 402 and the data line 403 and an intersection portion 405 serves as a pixel.

The scanning line 402 and the data line 403 are connected to an external driver circuit through a TAB tape 407. Reference numeral 408 denotes a group of wiring lines comprised of a mass of the scanning line 402. Reference numeral 409 denotes a group of wiring lines comprised of a mass of connection wiring line 406 that are connected to the data line 403. Though not shown, the TAB tape 407 may be replaced by TCP that is obtained by providing a TAB tape with an IC.

In FIG. 4B, reference numeral 410 denotes an adhesive material and 411 denotes a counter substrate that is bonded to the substrate 401 with the adhesive material 410. A photo-curable resin can be used for the adhesive material 410. An adhesive material which allows little gas leakage and which absorbs little moisture is preferably used. The counter substrate is preferably made from the same material as the substrate 401, and glass (including quartz glass) or plastic can be used. Here, a plastic material is used for the counter substrate.

Figure 4C:
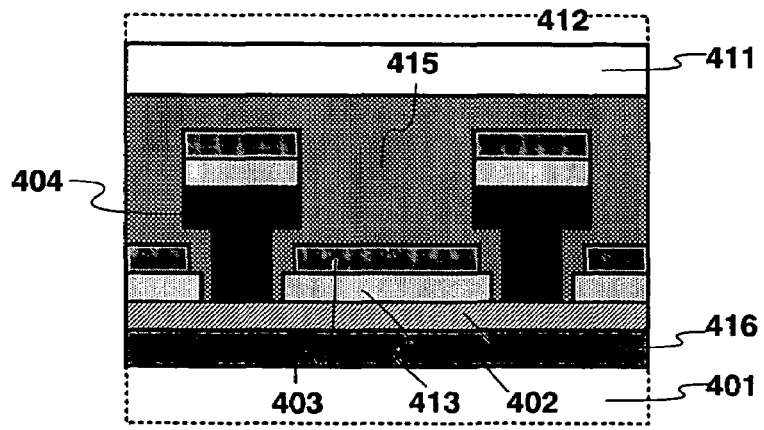

FIG. 4C is an enlarged view of the structure of a pixel region. Reference numeral 413 denotes a light emitting layer. As shown in FIG. 4C, lower layers of the bank 404 are narrower than upper layers and therefore the bank can physically separate the data lines 403 from one another. A pixel portion 414 surrounded by the adhesive material 410 is cut off from the outside air by a sealing member 415 formed of a resin. Degradation of an organic compound layer is thus prevented.

A light emitting device of the present invention having the above described structure can be manufactured with a extremely simple process, since the pixel portion 414 thereof is formed of a scanning line 402, a data line 403, a bank 404, and an organic compound layer 413.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable that the polarizing plate has a structure with less internal reflection by adjusting the refractive index in order to prevent light emitted from the organic compound layer. According to the light emitting device of the present invention, a bright display with higher light extraction efficiency, lower power consumption, and longer operation life can be obtained.

Embodiment 3

Figure 5A:
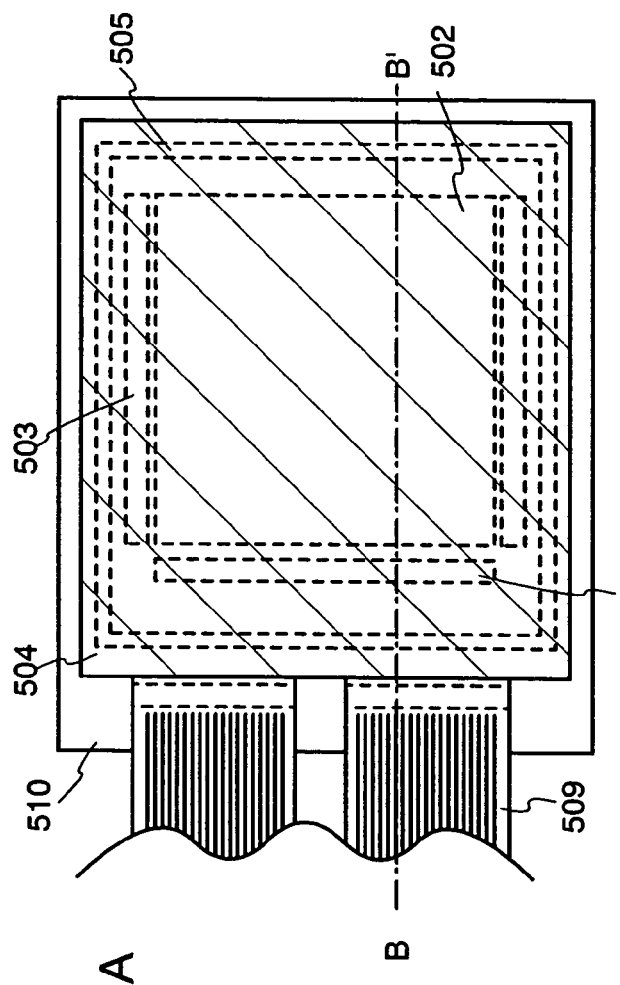
FIGS. 5A and 5B are diagrams showing a light emitting device of the present invention.
Figure 5B:
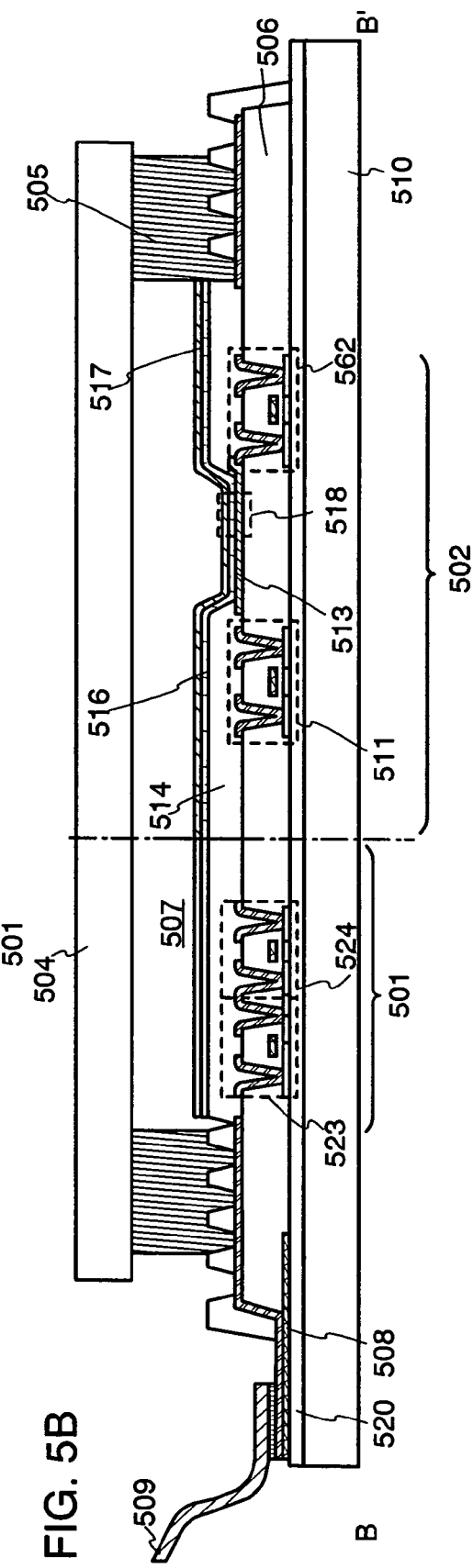

In this Embodiment Mode, a light emitting device utilizing the present invention to a pixel portion will be described with reference to FIG. 5A and 5B. FIG. 5A is a top view of a light emitting device and FIG. 5B is a cross-sectional view taken along the line A-A' of FIG. 5A. Reference numeral 501 indicated by a dotted line is a driver circuit portion (a source side driver circuit), 502 is a pixel portion, 503 is a driver circuit portion (a gate side driver circuit), 504 is a counter substrate, 505 is a adhesive material, and 507 surrounded by the adhesive material 505 is a space.

A film in which the refractive index is varied in the film thickness direction is formed as a transparent film 506. In this embodiment, a silicon oxynitride film in which the composition of nitrogen and oxygen is sequentially changed is formed as the transparent film 506. The transparent film 506 is formed by a method described in Embodiment 1.

Reference numeral 508 is a wiring for transmitting signals to be inputted to the source side driver circuit 501 and a gate side driver circuit 503. The wiring 508 receives a video signal, a clock signal, a start signal, a reset signal, or the like from a FPC (a flexible printed circuit) 509 that serves as an external input terminal. Though only the FPC is illustrated here; a PWB (a print wiring board) may be attached to the FPC. The light emitting device in this specification includes not only a body of light emitting device but also a light emitting device in the state of being attached with FPC or PWB.

Next, a cross-sectional structure of the light emitting device will be described with reference to FIG. 5B. Here, the source side driver circuit 501 that serves as a driver circuit portion and the pixel portion 502 are illustrated.

In the source side driver circuit 501, a CMOS circuit that is formed by combining an n-channel TFT 523 and a p-channel TFT 524. A TFT for forming a driver circuit may be formed of a known CMOS circuit, PMOS circuit, or NMOS circuit. A driver circuit formed on a substrate, which is referred to as a driver integrated type is described in this embodiment mode, but not exclusively, the driver circuit may be formed outside.

The pixel portion 502 is formed of plural pixels comprising a switching TFT 511, a current control TFT 512, and a first electrode 513 connected to the current control TFT 512 and the drain thereof. An insulating film 514 is formed to cover the edge portion of the first electrode 513.

A light emitting layer 516, and a second electrode 517 are respectively formed over the first electrode 513. The light emitting layer 516, and the second electrode 517 are respectively formed by the method shown in the embodiment modes of the invention.

By bonding the counter substrate 504 and the substrate 510 in which a element is formed with the adhesive material 505, a light emitting element 518 is provided for the space 507 surrounded by the substrate 510 in which the element is formed, the counter substrate 504, and the adhesive material 505. In addition to an inert gas (nitrogen, argon, or the like) that is used for filling the space 507, a resin may be used.

An epoxy resin is preferably used as the adhesive material 505. Further, the material is desirably the one which does not transmit moisture and oxygen as much as possible. In addition to a glass substrate and a quartz substrate which are used as the materials for the counter substrate 504, a plastic substrate formed of polyimide, polyamide, acrylic resin, epoxy resin, PES, PC, PET, PEN or the like may be used.

As described above, a light emitting device of the present invention can be obtained. The light emitting device of the present invention has an effect of obtaining higher light extraction efficiency, lower consumption, longer operation life, and brightness display.

Embodiment 4

A light emitting device wherein light is emitted from the side of the second electrode of the present invention is described in this embodiment mode.

Figure 6:
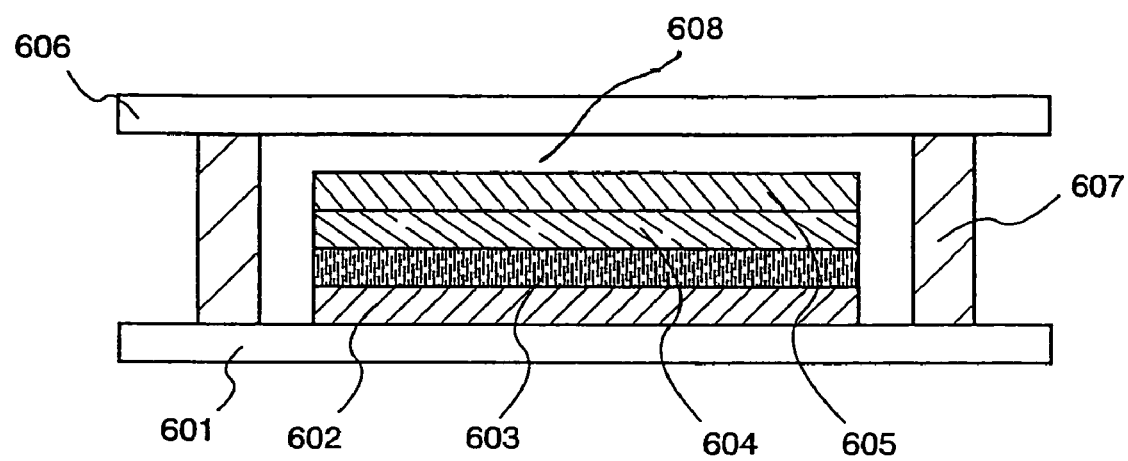
FIG. 6 is a diagram showing a cross-sectional structure of a top face emission type light emitting device of the present invention.

A structure of a light emitting device of the present invention is shown in FIG. 6. A first electrode 602 is formed over a substrate 601, a light emitting layer 603 is formed over the first electrode 602, a second electrode 604 is formed over the light emitting layer 603, and a transparent film 605 is formed over the second electrode. In this embodiment, the substrate in which an EL element is formed is bonded to a counter substrate 606 with an adhesive material 607, and an inert gas or resin 608 is sealed therebetween. In this embodiment, nitrogen is used for the inert gas.

A film having higher transmittance is preferably used for the second electrode 604 since light is emitted from a top face of the counter substrate 606. A thin metal film, a transparent conductive film, or a laminated film of thin metal film and a transparent conductive film is used for the second electrode 604. The transparent conductive film may be an ITO (indium tin oxide alloy) film, an indium oxide-zinc oxide alloy ($In_2O_3$—ZnO) film, a zinc oxide (ZnO) film, or the like. Further, ITO (indium tin oxide alloy) with 0.1 to 10 wt % of $SiO_2$, or ITO with 0.1 to 10 wt % of ZnO may me used, instead. The surface of the ITO with 0.1 to 10 wt % of $SiO_2$ is flattened progressively, thereby, preventing the gap between the two electrodes from occurring short circuit. In this embodiment, ITO is used. In this embodiment, either of the first electrode and the second electrode may be an anode or a cathode. The first electrode and the second electrode are formed by sputtering, vacuum deposition, or the like, and patterned by photolithography.

A film in which a refractive index is varied in the film thickness direction is formed as the transparent film 605 over the second electrode 604. A silicon oxynitride film formed of nitrogen, oxygen, and silicon is formed as the transparent film 605 in this embodiment. The refractive index in the transparent film is varied by the variation of the composition ratio by using nitrogen as the first substance and oxygen as the second substance. Note that the materials for the transparent film 605, the first substance and the second substance are not limited to those in this embodiment, and can be decided by the operator according to the second electrode 604 and the substance which is in contact with the interface at the opposite side of the second electrode (nitrogen in this embodiment).

Silicon is used as a target for sputtering. The electric current source for sputtering can be direct current (DC) or alternating current (AC). Argon, oxygen, and nitrogen can be used as the gas for sputtering.- The flow rate of nitrogen is gradually degreased from 30 sccm to 0 sccm, and the flow rate of oxygen is gradually increased from 0 sccm to 30 sccm, thereby forming the silicon oxynitride film. By changing the proportion of silicon oxide and silicon nitride in a growing film, the silicon oxynitride film in which the composition of nitrogen and oxygen is sequentially changed is formed.

Further, the flow rate of nitrogen is set to 30 sccm and the flow rate of oxygen is set to 0 sccm so as to form the silicon nitride film, then the flow rates are changed so as to form the silicon oxynitride film, and then, the flow rate of nitrogen is set to 0 sccm and the flow rate of oxygen is set to 30 sccm so as to form the silicon oxide film.

A fabrication method for silicon oxynitride film formed of nitrogen, oxygen, and silicon may be as follows. Two targets of silicon oxide and silicon nitride are used in sputter deposition equipment. The electric current source for sputtering can be direct current (DC) or alternating current (AC). The electric power of the silicon nitride target decreased from 3 kW to 0 W for the last time, and the electric power of the silicon oxide target is increased from 0 kW to 3 W, thereby forming the silicon oxynitride film. By changing the proportion of the silicon oxide and silicon nitride in the growing film, the silicon oxynitride film in which the composition of nitrogen and oxygen is sequentially changed is formed.

In addition, electric power of silicon nitride target is set to 3 kW and electric power of silicon oxide target is set to 0 W so as to form the silicon nitride film, then, the electric power is changed so as to form the silicon oxynitride film, and then, the electric power of silicon nitride target is set to 0 W and the electric power of silicon oxide is set to 3 kW so as to form the silicon oxide film.

In a light emitting device of this embodiment, difference in the refractive indexes of the transparent conductive film and silicon nitride film, and that of silicon oxide and nitrogen is small. Therefore, reflection of light at the respective interfaces is also reduced. Further, with sequentially changing the composition ratio of nitrogen and oxygen in the silicon oxynitride film, the refractive index is also sequentially changed. Therefore, the reflection of light is reduced. And, light exterior extraction efficiency can be improved.

A fabrication of the substrate, the EL element, and sealing can be performed as the same method as Embodiments 2 and 3.

As described above, a light emitting device of the present invention can be obtained. According to the present invention the light emitting device having few reflection of light at the film interfaces in the light emitting device, higher light extraction efficiency, lower consumption, longer operation life, and brightness display can be obtained.

Embodiment 5

According to the present invention, various modules (active matrix type liquid crystal module, active matrix type EL module and active matrix type EC module) can be completed. Namely, all the electronic apparatuses supplied with the modules can be completed according to the present invention.

Following can be given as such electronic apparatuses: video cameras; digital cameras; head mounted displays (goggle type displays); car navigation systems; projectors; car stereo; personal computers; portable information terminals (mobile computers, mobile telephones or electronic books etc.) etc. Examples of these are shown in FIGS. 7A to 17E and 8A to 8C.

Figure 7A:
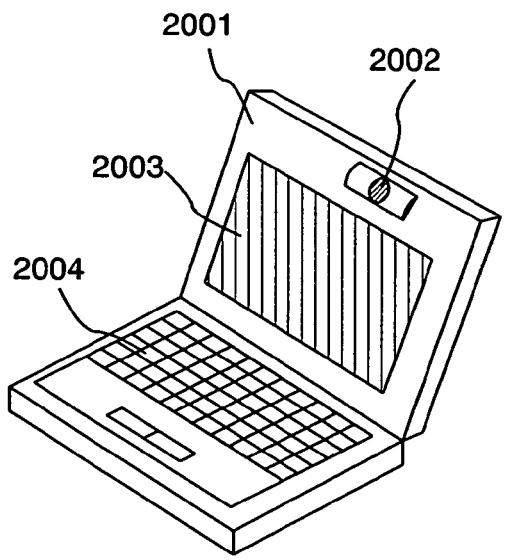
FIGS. 7A to 7E are diagrams showing electronic apparatuses of the present invention.

FIG. 7A is a personal computer which comprises a main body 2001, an image input portion 2002, a display portion 2003, a keyboard 2004 and the like. The personal computer having higher visibility and reliability can be realized by applying a light emitting device of the present invention to the display portion 2003.

Figure 7B:
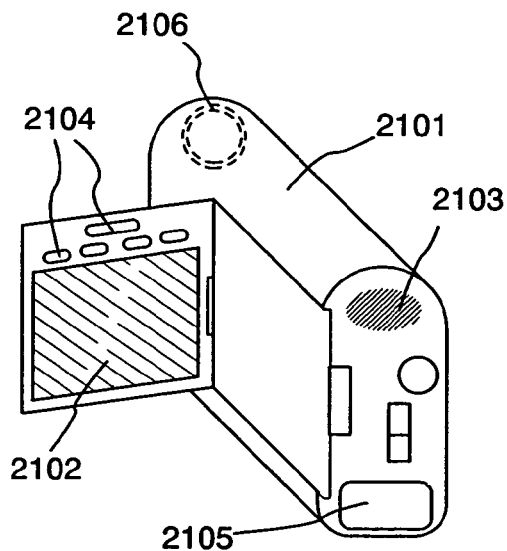

FIG. 7B is a video camera which comprises a main body 2101, a display portion 2102, a voice input portion 2103, operation switches 2104, a battery 2105, an image receiving section 2106, and the like. The video camera having higher visibility and reliability can be realized by applying a light emitting device formed of a light emitting element of the present invention to the display portion 2102.

Figure 7C:
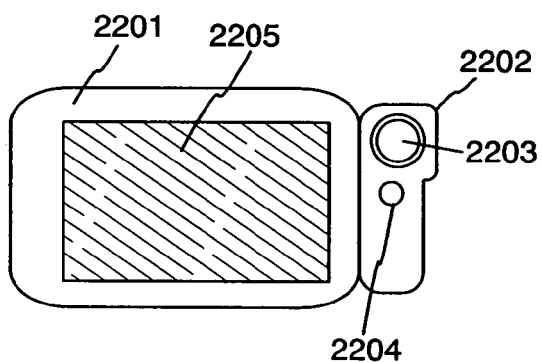

FIG. 7C is a mobile computer which comprises a main body 2201, a camera portion 2202, an image receiving portion 2203, operation switches 2204, a display portion 2205, and the like. The mobile computer having higher visibility and reliability can be realized by applying a light emitting device formed of a light emitting element of the present invention to the display portion 2205.

Figure 7D:
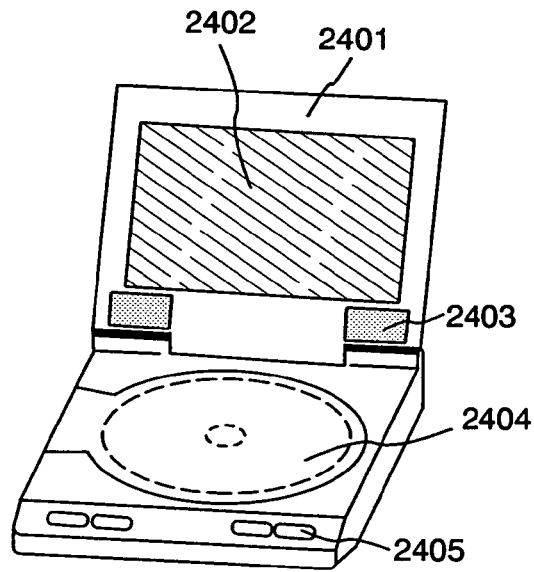

FIG. 7D is a player using a recording medium which records a program (hereinafter referred to as a recording medium), which comprises a main body 2401, a display portion 2402, a speaker portion 2403, a recording medium 2404, operation switches 2405 and the like. This apparatus includes DVD (digital versatile disc), CD, etc. for the recording medium, music appreciation, film appreciation, games and use for Internet can be realized. The player having higher visibility and reliability can be realized by applying a light emitting device formed of a light emitting element of the present invention to the display portion 2402.

Figure 7E:
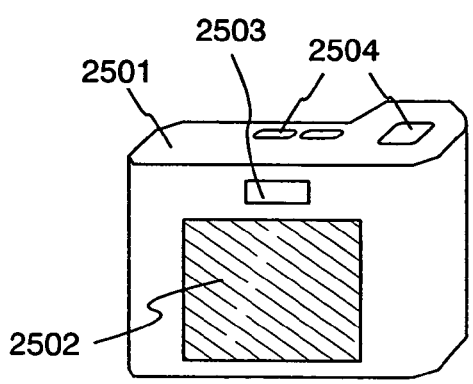

FIG. 7E is a digital camera which comprises a main body 2501, a display portion 2502, a view finder 2503, operation switches 2504, and an image receiving portion (not shown in the drawings). The digital camera having higher visibility and reliability can be realized by applying a light emitting device formed of a light emitting element of the present invention to the display portion 2205.

Figure 8A:
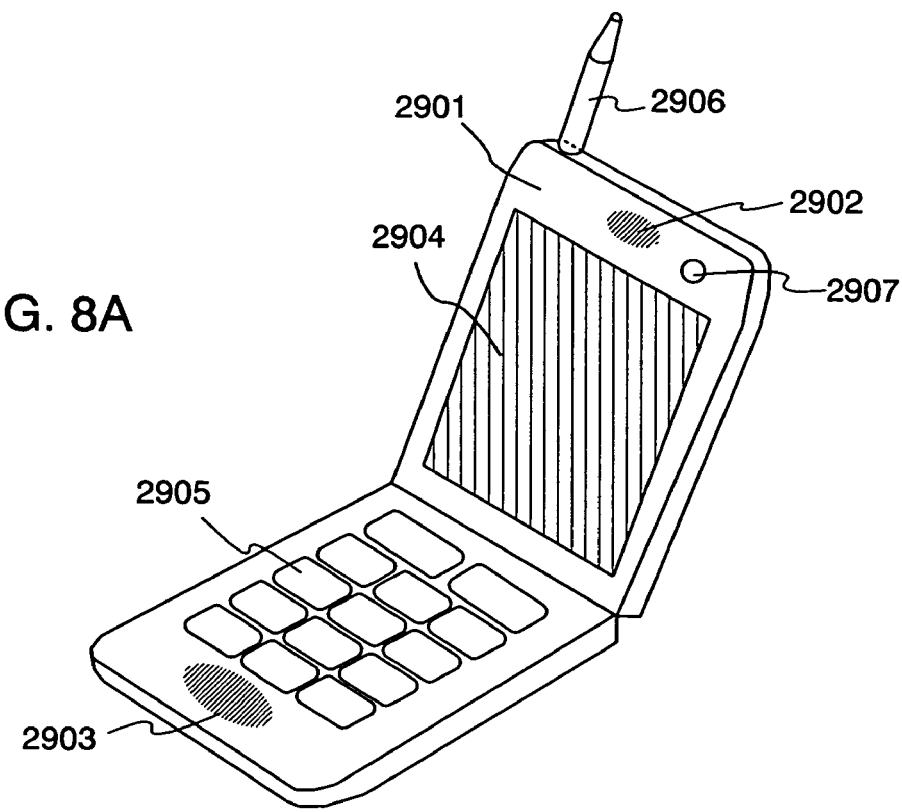
FIGS. 8A to 8C are diagrams showing electronic apparatuses of the present invention.

FIG. 8A is a mobile telephone which comprises a main body 2901, a voice output portion 2902, a voice input portion 2903, a display portion 2904, operation switches 2905, an antenna 2906, and an image input section (CCD, image sensor, etc.) 2907 etc. The mobile telephone having higher visibility and reliability can be realized by applying a light emitting device formed of a light emitting element of the present invention to the display portion 2904.

Figure 8B:
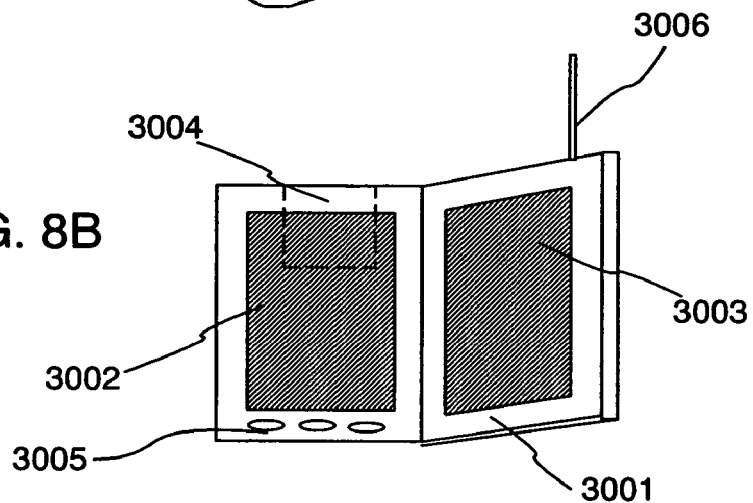

FIG. 8B is a portable book (electronic book) which comprises a main body 3001, display portions 3002 and 3003, a recording medium 3004, operation switches 3005, an antenna 3006 and the like. The portable book (electronic book) having higher visibility and reliability can be realized by applying a light emitting device formed of a light emitting element of the present invention to the display portion 3002.

Figure 8C:
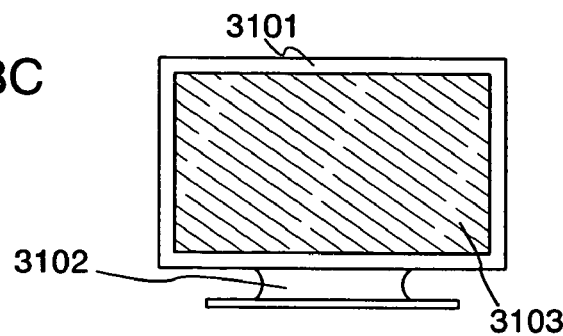
Figure 9:
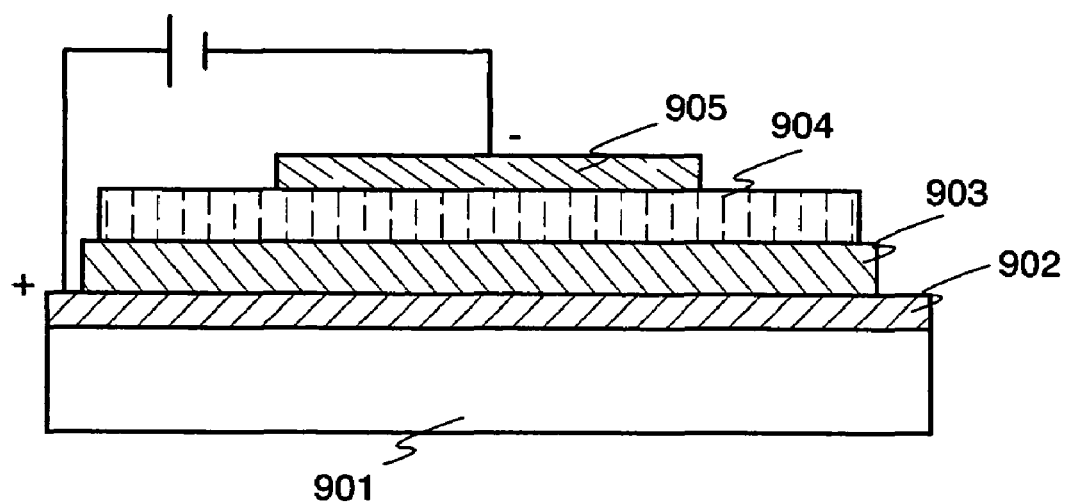
FIG. 9 is a diagram showing a conventional light emitting device.

FIG. 8C is a display which comprises a main body 3101, a supporting portion 3102, a display portion 3103 and the like. The display having higher visibility and reliability can be realized by applying a light emitting device formed of a light emitting element of the present invention to the display portion 3103.

In addition, the display shown in FIG. 8C is small and medium type or large type, for example, screen of the display sized 5 to 20 inches. Moreover, it is preferable to mass-produce to form such sized display portion by executing a multiple pattern using a substrate having its side of 1 m.

As described above, the applicable range of the present invention is very large, and the invention can be applied to electronic apparatuses of various areas. Note that the electronic apparatuses of this embodiment can be achieved by utilizing any combination of constitutions in Embodiment 1 to Embodiment 5.

According to the present invention, light extraction efficiency can be improved. Therefore, a light emitting device with lower consumption, longer operation life, and higher reliability, and a manufacturing method thereof can be provided.

This application is based on Japanese Patent Application serial No. 2003-033054 filed in Japan Patent Office on Feb. 12, 2003, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A light emitting device comprising:
a substrate having an insulating surface;
a first transparent film comprising silicon oxide formed over the substrate;
a second transparent film comprising silicon oxynitride over the first transparent film;
a third transparent film comprising silicon nitride over the second transparent film;
a first electrode formed over the third transparent film;
a layer including an organic compound formed over the first electrode; and
a second electrode formed over the layer including the organic compound,
wherein a refractive index of the second transparent film gradually increases from a first interface at a side of the first transparent film to a second interface at a side of the third transparent film.

2. The light emitting device according to claim 1, wherein the light emitting device is incorporated in at least one selected from the group consisting of a personal computer, a video camera, a mobile computer, a player using a recording medium, a digital camera, a mobile telephone, and an electronic book.

3. A light emitting device comprising:
a first substrate having an insulating surface;
a first electrode formed over the first substrate;
a layer including an organic compound formed over the first electrode;
a second electrode formed over the layer including the organic compound;
a first transparent film comprising silicon nitride formed over the second electrode;
a second transparent film comprising silicon oxynitride over the first transparent film;
a third transparent film comprising silicon oxide over the second transparent film; and
a second substrate over the transparent film, wherein a gap between the transparent film and the second substrate is filled with a substance,
wherein the substance is an inert gas or a resin, and
wherein a refractive index of the transparent film gradually decreases from a first interface at a side of the second electrode to a second interface at a side of the substance.

4. The light emitting device according to claim 3, wherein the light emitting device is incorporated in at least one selected from the group consisting of a personal computer, a video camera, a mobile computer, a player using a recording medium, a digital camera, a mobile telephone, and an electronic book.

5. A light emitting device comprising:
a substrate having an insulating surface;
a first transparent film comprising silicon oxide formed over the substrate;
a second transparent film comprising silicon oxynitride over the first transparent film;
a third transparent film comprising silicon nitride over the second transparent film;
a first electrode formed over the third transparent film;
a layer including an organic compound formed over the first electrode; and
a second electrode formed over the layer including the organic compound,
wherein a composition ratio of oxygen in the second transparent film decreases, while a composition ratio of nitrogen in the second transparent film increases from a first interface at a side of the first transparent film to a second interface at a side of the third transparent film, and
wherein a refractive index of the second transparent film gradually increases from the first interface to the second interface.

6. The light emitting device according to claim 5, wherein the light emitting device is incorporated in at least one selected from the group consisting of a personal computer, a video camera, a mobile computer, a player using a recording medium, a digital camera, a mobile telephone, and an electronic book.

7. A light emitting device comprising:
a first substrate having an insulating surface;
a first electrode formed over the first substrate;
a layer including an organic compound formed over the first electrode;
a second electrode formed over the layer including the organic compound;
a first transparent film comprising silicon nitride formed over the second electrode;
a second transparent film comprising silicon oxynitride over the first transparent film;
a third transparent film comprising silicon oxide over the second transparent film; and
a second substrate over the transparent film, wherein a gap between the transparent film and the second substrate is filled with a substance,
wherein the substance is an inert gas or a resin,
wherein a composition ratio of oxygen in the transparent film increases, while a composition ratio of nitrogen in the transparent film decreases from a first interface at a side of the second electrode to a second interface at a side of the substance, and
wherein a refractive index of the transparent film gradually decreases from the first interface to the second interface.

8. The light emitting device according to claim 7, wherein the light emitting device is incorporated in at least one selected from the group consisting of a personal computer, a video camera, a mobile computer, a player using a recording medium, a digital camera, a mobile telephone, and an electronic book.

9. A method for manufacturing a light emitting device comprising:
forming a first transparent film comprising silicon oxide over a substrate having an insulating surface;
forming a second transparent film comprising silicon oxynitride over the first transparent film;
forming a third transparent film comprising silicon nitride over the second transparent film;
forming a first electrode over the third transparent film;

forming a layer including an organic compound over the first electrode; and forming a second electrode over the layer including the organic compound, wherein the second transparent film is formed so that a refractive index of the transparent film gradually increases from a first interface at a side of the first transparent film to a second interface at a side of the third transparent film.

10. The method for manufacturing a light emitting device according to claim 9, wherein the light emitting device is incorporated in at least one selected from the group consisting of a personal computer, a video camera, a mobile computer, a player using a recording medium, a digital camera, a mobile telephone, and an electronic book.

11. A method for manufacturing a light emitting device comprising:

forming a first electrode over a first substrate having an insulating surface;

forming a layer including an organic compound over the first electrode;

forming a second electrode over the layer including the organic compound;

forming a first transparent film comprising silicon nitride over the second electrode;

forming a second transparent film comprising silicon oxynitride over the first transparent film;

forming a third transparent film comprising silicon oxide over the second transparent film;

providing a second substrate over the transparent film; and filling at least a gap between the transparent film and the second substrate with a substance, wherein the substance is an inert gas or a resin, and wherein the transparent film is formed so that a refractive index of the transparent film gradually decreases from a first interface at a side of the second electrode to a second interface at a side of the substance.

12. The method for manufacturing a light emitting device according to claim 11, wherein the light emitting device is incorporated in at least one selected from the group consisting of a personal computer, a video camera, a mobile computer, a player using a recording medium, a digital camera, a mobile telephone, and an electronic book.

13. A method for manufacturing a light emitting device comprising:

forming a transparent film comprising silicon oxynitride over a substrate having an insulating surface, wherein the transparent film is formed by sputtering using a silicon oxide target and a silicon nitride target;

forming a first electrode over the transparent film;

forming a layer including an organic compound over the first electrode; and forming a second electrode over the layer including the organic compound, wherein the transparent film is formed so that a composition ratio of oxygen in the transparent film gradually decreases, while a composition ratio of nitrogen in the transparent film gradually increases from a first interface at a side of the substrate to a second interface at a side of the first electrode.

14. The method for manufacturing a light emitting device according to claim 13, wherein the transparent film is formed so that the refractive index of the transparent film gradually increases from the first interface to the second interface.

15. The method for manufacturing a light emitting device according to claim 13, wherein the light emitting device is incorporated in at least one selected from the group consisting of a personal computer, a video camera, a mobile computer, a player using a recording medium, a digital camera, a mobile telephone, and an electronic book.

16. A method for manufacturing a light emitting device comprising:

forming a first electrode over a first substrate having an insulating surface;

forming a layer including an organic compound over the first electrode;

forming a second electrode over the layer including the organic compound;

forming a transparent film comprising silicon oxynitride over the second electrode, wherein the transparent film is formed by sputtering using a silicon oxide target and a silicon nitride target;

providing a second substrate over the transparent film; and filling a gap between the transparent film and the second substrate with a substance, wherein the substance is an inert gas or a resin, and wherein the transparent film is formed so that a composition ratio of nitrogen in the transparent film gradually decreases, while a composition ratio of oxygen in the transparent film gradually increases from a first interface at a side of the second electrode to a second interface at a side of the substance.

17. The method for manufacturing a light emitting device according to claim 16, the transparent film is formed so that the refractive index of the transparent film gradually decreases from the first interface to the second interface.

18. The method for manufacturing a light emitting device according to claim 16, wherein the light emitting device is incorporated in at least one selected from the group consisting of a personal computer, a video camera, a mobile computer, a player using a recording medium, a digital camera, a mobile telephone, and an electronic book.

* * * * *